(12) United States Patent
Jedlicka et al.

(10) Patent No.: US 6,252,220 B1
(45) Date of Patent: Jun. 26, 2001

(54) SENSOR COVER GLASS WITH INFRARED FILTER

(75) Inventors: Josef E. Jedlicka, Rochester; Debra S. Vent, Webster, both of NY (US)

(73) Assignee: Xerox Corporation, Stamford, CT (US)

( * ) Notice: Subject to any disclaimer, the term of this patent is extended or adjusted under 35 U.S.C. 154(b) by 0 days.

(21) Appl. No.: 09/299,122

(22) Filed: Apr. 26, 1999

(51) Int. Cl.[7] .................................................. H01L 27/00
(52) U.S. Cl. .......................................... 250/208.1; 358/474
(58) Field of Search ............................... 250/208.1; 358/474, 358/493, 494

(56) References Cited

U.S. PATENT DOCUMENTS

| | | | |
|---|---|---|---|
| 3,596,635 | 8/1971 | Smitzer | 118/637 |
| 3,864,722 | 2/1975 | Carnes | 357/24 |
| 4,016,597 | 4/1977 | Dillon et al. | 358/41 |
| 4,034,396 | 7/1977 | Nakamura et al. | 357/30 |
| 4,173,765 | 11/1979 | Heald et al. | 357/23 |
| 4,242,694 | 12/1980 | Koike et al. | 357/30 |
| 4,285,007 | 8/1981 | Nakano et al. | 358/44 |
| 4,418,284 | 11/1983 | Ogawa et al. | 250/578 |
| 4,658,289 | 4/1987 | Nagano et al. | 358/75 |
| 4,672,457 | 6/1987 | Hyatt | 358/236 |
| 4,691,243 | 9/1987 | Cannella et al. | 358/294 |
| 4,727,407 | 2/1988 | Nobue et al. | 357/30 |
| 4,739,396 | 4/1988 | Hyatt | 358/60 |
| 4,750,838 | 6/1988 | De Wolf et al. | 356/445 |
| 4,827,118 | 5/1989 | Shibata et al. | 250/211 J |
| 4,862,253 | 8/1989 | English et al. | 358/42 |
| 4,899,214 | 2/1990 | Robbins | 358/75 |
| 4,905,039 | 2/1990 | Terashita | 355/35 |
| 4,933,983 | 6/1990 | Hiramatsu | 382/8 |
| 4,967,081 | 10/1990 | Quad et al. | 250/338.1 |
| 5,024,923 | 6/1991 | Suzuki et al. | 430/372 |
| 5,068,913 | 11/1991 | Sugiura | 382/61 |
| 5,114,478 | 5/1992 | Auslander et al. | 106/20 |
| 5,144,498 | 9/1992 | Vincent | 359/885 |
| 5,159,199 | 10/1992 | LaBaw | 250/339 |
| 5,166,784 | 11/1992 | Suda et al. | 358/75 |
| 5,256,883 | 10/1993 | Weichmann | 250/559 |
| 5,283,691 | 2/1994 | Ogasawara | 359/566 |
| 5,434,645 | 7/1995 | Usami | 355/38 |
| 5,473,513 | 12/1995 | Quinn | 361/760 |
| 5,489,457 | 2/1996 | Vent | 428/40 |
| 5,530,278 | 6/1996 | Jedkicka et al. | 257/432 |
| 5,545,913 | 8/1996 | Quinn et al. | 257/443 |
| 5,557,326 | 9/1996 | Rantasuo et al. | 348/272 |
| 5,604,362 | 2/1997 | Jedlicka et al. | 257/233 |
| 5,648,653 | 7/1997 | Sakamoto et al. | 250/208.1 |

(List continued on next page.)

FOREIGN PATENT DOCUMENTS

| | | |
|---|---|---|
| 0 658428 A1 | 6/1995 | (EP) . |
| 1-175455 | 7/1989 | (JP) . |
| 2-146772 | 6/1990 | (JP) . |
| 5-343655 | 12/1993 | (JP) . |
| 6-311302 | 11/1994 | (JP) . |
| 7-74899 | 3/1995 | (JP) . |
| 7-122720 | 5/1995 | (JP) . |
| 10065135 | 3/1998 | (JP) . |
| WO 9746982 | 12/1997 | (WO) . |
| WO 9834397 | 8/1998 | (WO) . |
| WO 9950682 | 10/1999 | (WO) . |

Primary Examiner—Stephone B. Allen
(74) Attorney, Agent, or Firm—Paul F. Daebeler; Christopher D. Wait

(57) ABSTRACT

The present invention relates to a sensor cover glass for covering photosensitive chips for generating electrical signals from an original image, as would be found for example in a digital scanner, copier, facsimile machine, or other digital imaging device or system. More specifically, the present invention relates to providing a sensor cover glass with an infrared filter material for blocking infrared light from reaching the photosensitive chips. This system is particularly applicable to color input imaging devices or systems.

17 Claims, 9 Drawing Sheets

U.S. PATENT DOCUMENTS

| | | | |
|---|---|---|---|
| 5,665,963 | 9/1997 | Campbell | 250/226 |
| 5,668,596 | 9/1997 | Vogel | 348/222 |
| 5,691,760 | 11/1997 | Hosier et al. | 347/238 |
| 5,714,759 | 2/1998 | Nelson | 250/343 |
| 5,724,152 | 3/1998 | Hayashi et al. | 358/296 |
| 5,771,315 | 6/1998 | Matsuyama | 382/191 |
| 5,777,329 | 7/1998 | Westphal et al. | 250/339.02 |
| 5,790,211 | 8/1998 | Seachman et al. | 349/3 |
| 5,808,297 | 9/1998 | Jedlicka et al. | 250/226 |
| 5,834,761 | 11/1998 | Okada et al. | 250/208.1 |
| 5,841,137 | 11/1998 | Whitney | 250/338.5 |

SENSOR COVER GLASS WITH INFRARED FILTER

FIELD OF THE INVENTION

The present invention relates to a sensor cover glass having an infrared filter for covering photosensitive chips for generating electrical signals from an original image, as would be found for example in a digital scanner, copier, facsimile machine, or other document generating or reproducing device. More specifically, the present invention relates to providing a sensor cover glass for blocking infrared light from reaching the photosensitive chips. The present invention is particularly applicable to color input imaging devices or systems.

BACKGROUND OF THE INVENTION

Infrared optical filters have been used for a variety of instruments and applications to filter or separate light energy. Typical uses include UV curing units, scanning instruments and other sensing applications as shown in the sales literature, SWP & LWP Filter Coatings for Glass Substrates, which is provided by Evaporated Coatings, Inc., for example.

Image sensor arrays typically comprise a linear array of photosensors which raster scan an image bearing document and convert the microscopic image areas viewed by each photosensor to image signal charges. Following an integration period, the image signal charges are amplified and transferred as an analog video signal to a common output line or bus through successively actuated multiplexing transistors. One example of such an array is a charged-coupled device (CCD).

For high-performance image sensor arrays, a preferred design includes an array of photosensors of a width comparable to the width of a page being scanned, to permit one-to-one imaging generally without the use of reductive optics. In order to provide such a "full-width" array, however, relatively large silicon structures must be used to define the large number of photosensors. A preferred technique to create such a large array is to align several butted silicon chips, each chip defining a small linear array thereon.

The silicon chips which are butted to form a single full-width array are typically created by first creating the circuitry for a plurality of individual chips on a single silicon wafer. The silicon wafer is then cut or "diced," around the circuit areas to yield discrete chips. Typically, the technique for dicing the chips includes a combination of chemical etching and mechanical sawing. On each chip, the photosensors are spaced with high resolution from one end of a chip to the other; the length of each diced chip from one end of the array thereon to the other requires precision dicing. It would be desirable to dice each individual chip with a precise dimension along the linear array of photosensors, so that, when a series of chips are butted end-to-end to form a single page-width linear array, there is a minimum disruption of spacing from an end photosensor on one chip to a neighboring photosensor at the end of a neighboring chip. Ideally, the spacing, or pitch, across an entire full-width linear array should be consistent regardless of the configuration of silicon chips forming the array.

Preferably, the full-width array extends the entire length of a document, such as eleven inches. Usually, the full-width array is used to scan line by line across the width of a document with the document being moved or stepped lengthwise in synchronism therewith. A typical architecture for such a sensor array is given, for example, in U.S. Pat. No. 5,473,513. When the original document moves past the full-width array, each of the photosensors converts reflected light from the original image into electrical signals. The motion of the original image perpendicular to the linear array causes a sequence of signals to be output from each photosensor, which can be converted into digital data.

With the gradual introduction of color-capable products into the office equipment market, it has become desirable to provide scanning systems which are capable of converting light from full-color images into separate trains of image signals, each train representing one primary color. In order to obtain the separate signals relating to color separations in a full-color image, one technique is to provide on each semiconductor chip multiple parallel linear arrays of photosensors, each of the parallel arrays being sensitive to one primary color. Typically, this arrangement can be achieved by providing multiple linear arrays of photosensors which are physically identical except for a selectively translucent primary-color overlay over the photosensitive areas, or "photosites," for that linear array. In other words, the linear array which is supposed to be sensitive to red light only will have a translucent red layer placed on the photosites thereof, and such would be the case for a blue-sensitive array, a green-sensitive array, or any other color-sensitive array. These translucent layers are also referred to as absorption filter layers, because they selectively adsorb or block light having certain frequencies or wavelengths from reaching the photosensitive areas. Although it is preferable to use three linear arrays, any number of linear arrays can be used. As the chips are exposed to an original full-color image, only those portions of the image, which correspond to particular primary colors, will reach those photosensors assigned to the primary color.

The most common substances for providing these selectively translucent filter layers over the photosites are polyimide or acrylic. For example, polyimide is typically applied in liquid form to a batch of photosensor chips while the chips are still in undiced, wafer form. After the polyimide liquid is applied to the wafer, the wafer is centrifuged to provide an even layer of a particular polyimide. In order to obtain the polyimide having the desired primary-color-filtering properties, it is well known to dope the polyimide with either a pigment or dye of the desired color, and these dopants are readily commercially available. When it is desired to place different kinds of color filters on a single chip, a typical technique is to first apply an even layer of polyimide over the entire main surface of the chip (while the chip is still part of the wafer) and then remove the unnecessary parts of the filter by photo-etching or another well known technique. Typically, the entire filter layer placed over the chip is removed except for those areas over the desired set of photosites. Acrylic is applied to the wafer in a similar manner. After the chips are mounted to a substrate as taught in U.S. Pat. No. 5,473,513, a glass cover is placed over the chips and mounted on the substrate to provide physical protection of the chips. In the prior art, the glass cover is clear and transmits all light including infrared light. However, infrared light received by the photosites can be mistakenly interpreted as visible light by the photosites, which decreases image quality.

SUMMARY OF THE INVENTION

According to an embodiment of the present invention, there is provided an assembly including a substrate; a plurality of photosensitive chips mounted to the substrate and arranged to provide at least one linear array of photosites on the substrate, each of the photosensitive chips being in contact with a neighboring photosensitive chip; a sensor cover glass covering the photosensitive chips and mounted to the substrate; and an infrared filter layer deposited on the sensor cover glass to prevent infrared light from reaching the photosensitive chips.

Preferably, the infrared filter layer covers only the top surface of the sensor cover glass from one end of the sensor cover glass to the other end of the sensor cover glass. Also, the photosensitive chips preferably have multiple parallel linear arrays of photosites, wherein each multiple parallel linear array has a selectively translucent filter layer.

The assembly can be incorporated into any digital device or digital imaging system.

DETAILED DESCRIPTION OF THE PRESENT INVENTION

Figure 1:
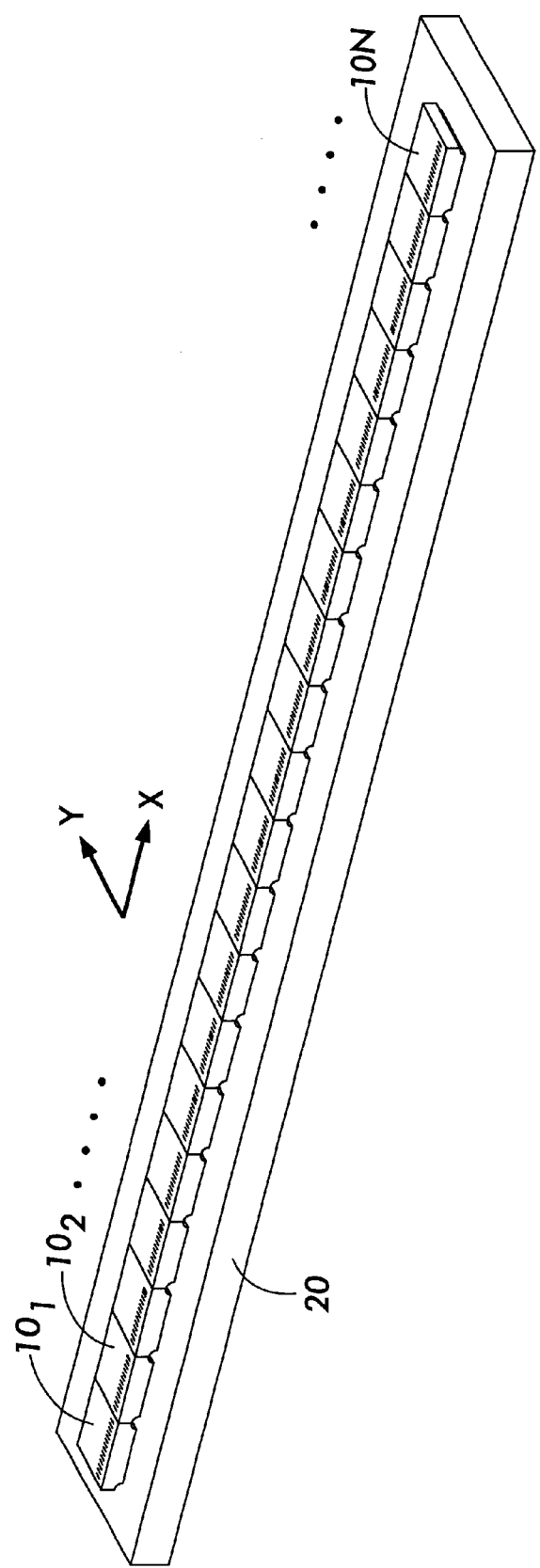
FIG. 1 is a perspective view of a base substrate having a plurality of butted photosensitive chips mounted thereon to form a full width array.

FIG. 1 shows a plurality of photosensitive chips 10 mounted and butted on a substrate 20 from end to end to form an effective collinear array of photosites, which extends across a page image being scanned for a scanner, copier, facsimile machine or other document reading or generating device. Generally, each individual photosite is adapted to output a charge or voltage signal indicative of the intensity of light of a certain type impinging thereon; various structures, such as transfer circuits, or charged coupled devices, are known in the art for processing signal output by the various photosites.

Figure 2:
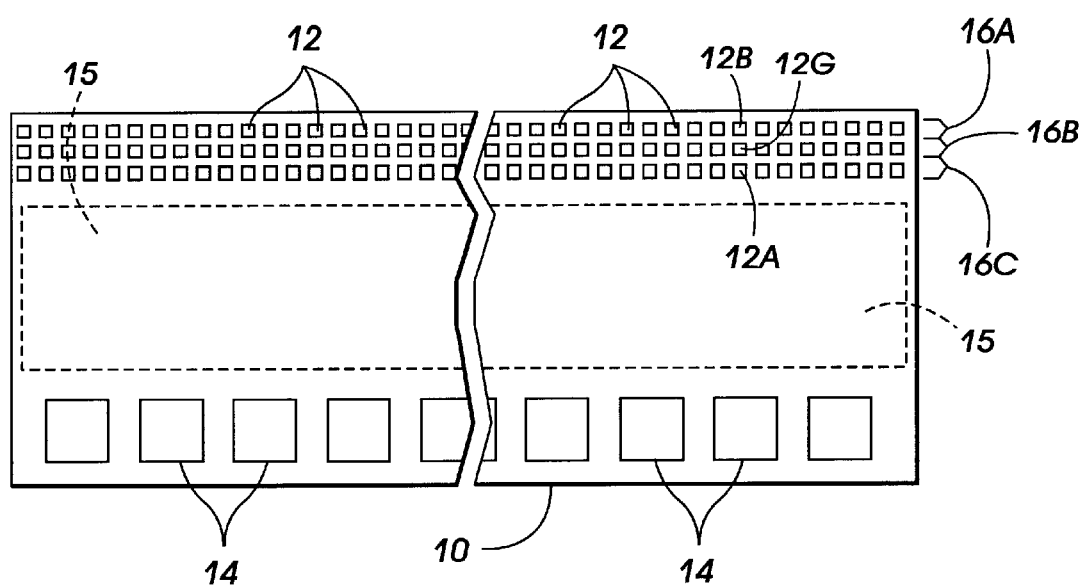
FIG. 2 is a plan view showing a photosensitive chip relevant to the present invention.

FIG. 2 is a plan view showing one of these photosensitive chips 10 relevant to the claimed invention. The photosensitive chip 10 is generally made of a semiconductor substrate, as is known in the art, in which circuitry and other elements are formed, such as by photolithographic etching. A few of the most relevant structures are one or more linear arrays of photosites 12, each of which forms the photosensitive surface of circuitry within the photosensitive chip 10, and a set of bonding pads 14. The photosites 12 are typically arranged in a linear array along one main dimension of the photosensitive chip 10, with each photosite 12 along the array corresponding to one pixel in an image signal. As will be described in detail below, the photosites 12 are preferably for sensing the three primary colors, blue, green and red. Photosites 12, which sense blue, green and red, are referred to as photosites 12B, 12G and 12R. However, the photosites 12 sensing blue, green and red could be replaced with photosites sensing yellow, magenta and cyan, for example. Any other suitable combination of color sensitive photosites may also be used. Each photosite is associated with a corresponding photosensor. Preferably, there are three parallel linear arrays 16a, 16b, and 16c for the three primary colors.

The bonding pads 14 are distinct surfaces on the main surface of the photosensitive chip 10, and are intended to accept wire bonds attached thereto. The bonding pads 14 thus serve as the electronic interface between the photosensitive chip 10 and any external circuitry. The circuitry for obtaining signals related to light directed to the photosites 12, and for unloading image data from the photosensitive chip 10 is generally indicated as 15. The circuitry 15 is generally deposited between a linear array of photosites 12 and a linear array of bonding pads 14. However, any number of multiple parallel linear arrays may be provided on each photosensitive chip 10.

Figure 3:
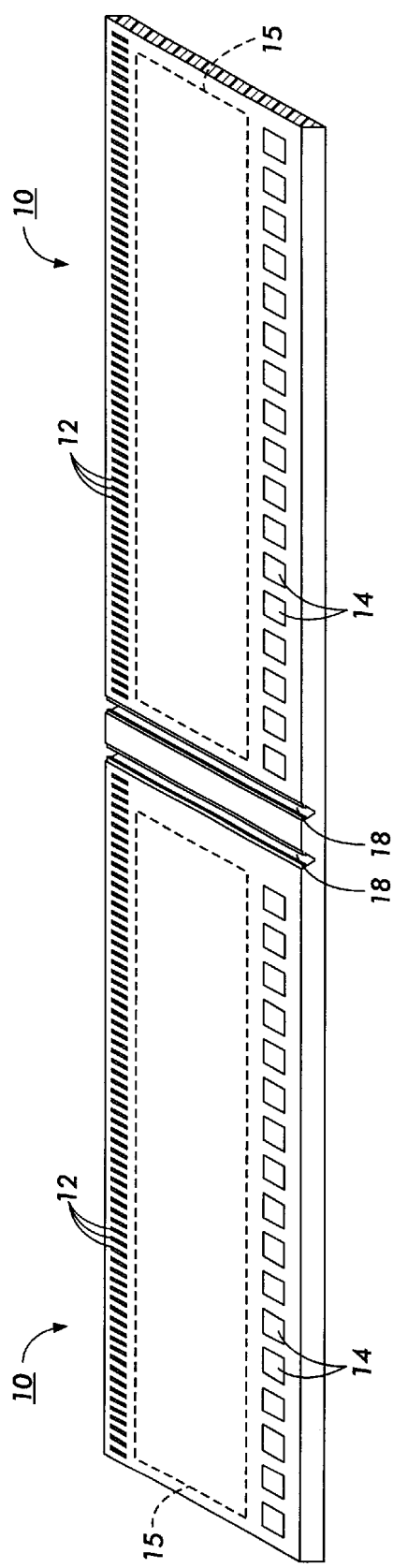
FIG. 3 is a perspective view showing two photosensitive chips relevant to the present invention.
Figure 4:
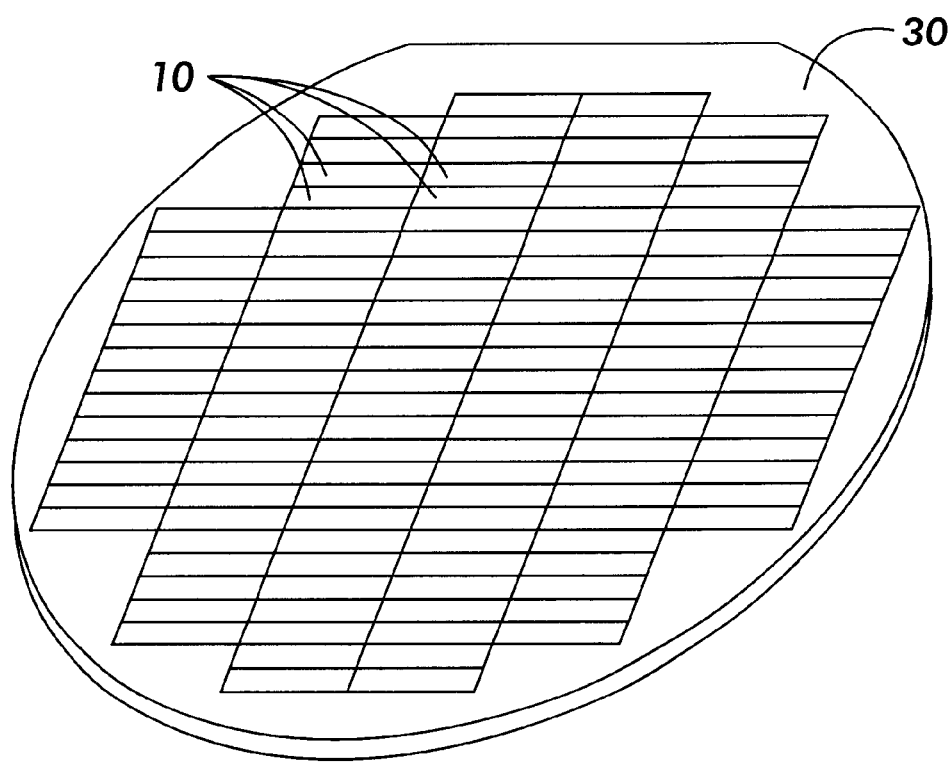
FIG. 4 is a perspective view of a semiconductor wafer relevant to the present invention.

Photosensitive chips 10 are typically formed in batches on semiconductor wafers, which are subsequently cleaved, or "diced," to create individual photosensitive chips. Typically, the semiconductor wafers are made of silicon. As is known in the art, photolithographically etched V-grooves 18 define precisely the intended boundaries of a particular photosensitive chip 10 for dicing as shown in the perspective view of two adjacent photosensitive chips 10 in FIG. 3. Thus, all of the photosites 12, bonding pads 14 and circuitry 15 for relatively large number of photosensitive chips 10 are etched simultaneously onto a single semiconductor wafer. The region between the V-grooves 18 is called the tab region. FIG. 4 shows a typical semiconductor wafer 30, in isolation, wherein a relatively large number of photosensitive chips 10 are created in the wafer 30 prior to dicing thereof. Each photosensitive chip 10 has a distinct photosensitive chip area within the main surface of the wafer 30. The phrase "chip area" refers to a defined area within the main surface of the wafer 30 which is intended to comprise a discrete photosensitive chip 10 after the dicing step, when individual photosensitive chips 10 (FIG. 2) are separated from the rest of the wafer 30.

Figure 5:
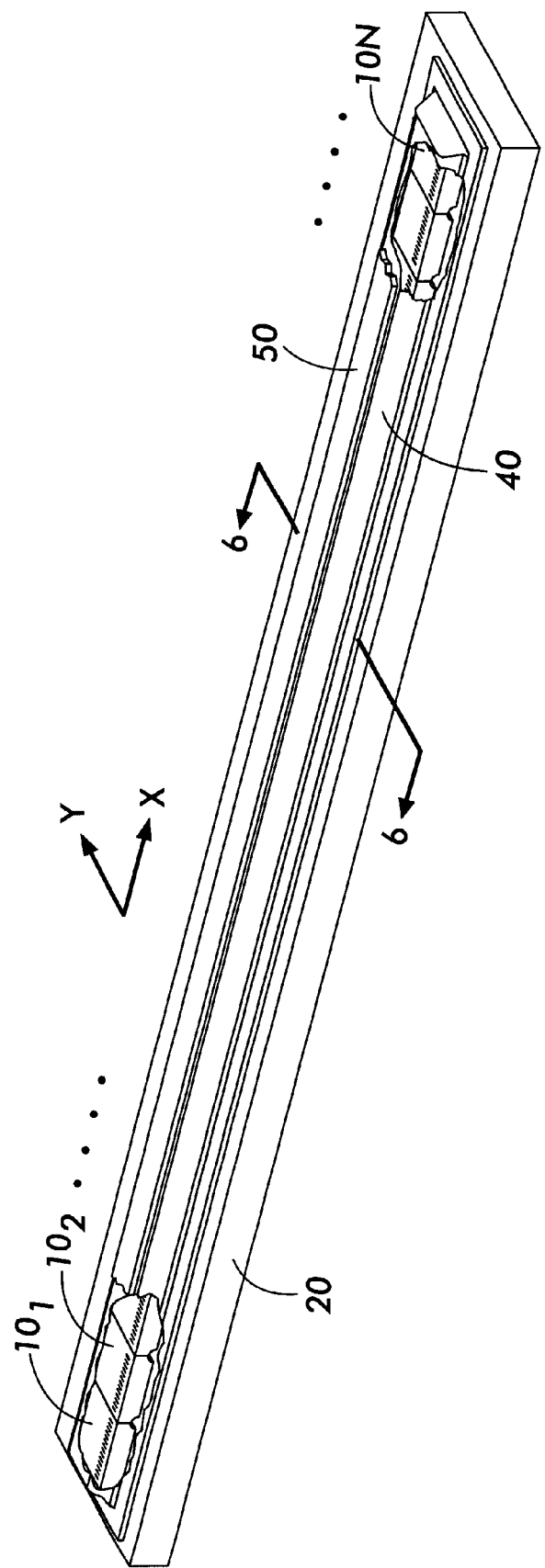
FIG. 5 is a partial plan view showing a sensor cover glass according to the present invention.

FIG. 5 shows a partial plan view of a sensor cover glass 40 with an infrared filter 50 deposited on the sensor cover glass 40 in accordance with the present invention. Sensor cover glass 40 is preferably a formed glass with feet or flanges 45. Preferably, the entire top surface of the sensor cover glass 40 is covered with the infrared filter layer 50, so that the sensor cover glass 40 and infrared filter layer 50 cover the photosensitive chips 10 of the full width array of FIG. 1. The infrared filter layer 50 on the sensor cover glass 40 can have the properties shown in ECI#1001 of the sales publication SWP & LWP Filter Coatings for Glass Substrates, which is manufactured by Evaporated Coatings, Inc., for example.

Figure 6:
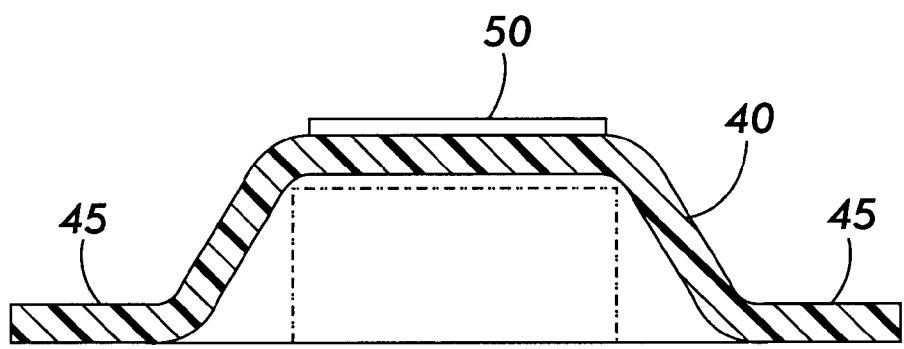
FIG. 6 is a partial cross sectional view along the line 6—6 in the direction of the arrows in FIG. 5, showing the infrared filter layer deposited on the sensor cover glass.

FIG. 6 is a cross sectional view along the line 6—6 in the direction of the arrows in FIG. 5, showing an infrared filter layer 50 deposited on the top surface of the sensor cover glass 40. Preferably, the top surface of the sensor cover glass 40 is covered with the infrared filter layer 50 from one end of the sensor cover glass 40 to the other end of the sensor cover glass 40 using a vacuum deposition process. Further, although the infrared filter layer 50 may be deposited onto part of the side portions of the sensor cover glass 40, the infrared filter layer 50 can not cover the entire surface of the sensor cover glass 40 because this would interfere with bonding flanges 45 of sensor cover glass 40 to the substrate 20. The bonding medium is ultraviolet sensitive adhesive, which bonds the flanges 45 to the substrate 20.

Figure 7:
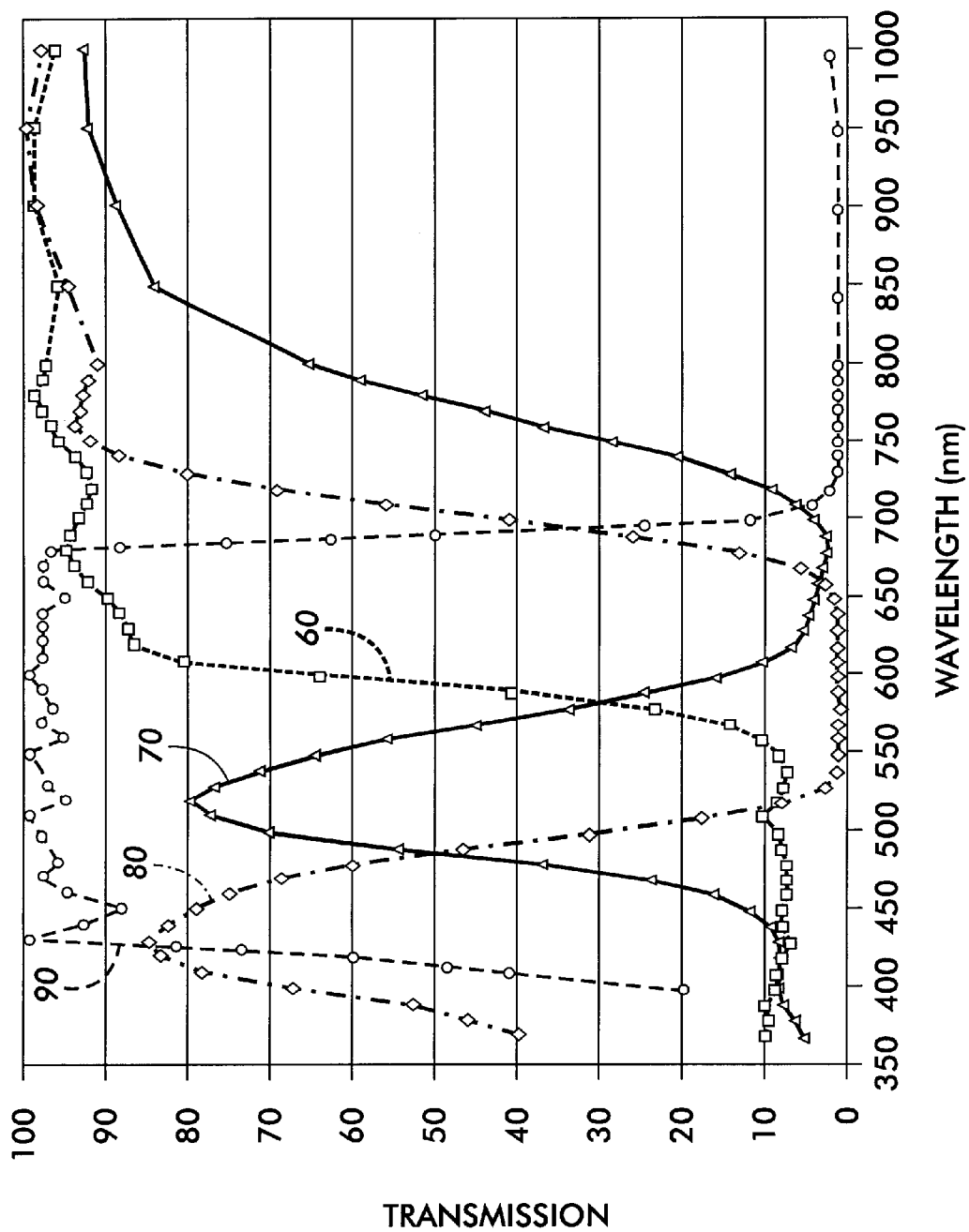
FIG. 7 is a graph showing the wavelengths of light which are transmitted through the sensor cover glass of the present invention.

FIG. 7 shows a graph of the wavelengths of light which are transmitted through the sensor cover glass 40 with the infrared filter layer 50 in accordance with the present invention. The primary colors red, green and blue are generally shown in both the visible region (approximately 400 nanometers to 700 nanometers) and infrared region (approximately 700 nanometers to one micron) by reference numerals 60, 70 and 80. As can be seen from the graph, the primary colors tend to converge in the infrared region. However, the different primary colors can be more easily identified in the visible light region. When the photosites 12 receive light, the light is converted into electrical signals and transmitted to a digital processing unit, which is typically part of a scanner. The output of the digital processing unit may be raster output scan lines. An example of a scanner will be discussed later with respect to FIGS. 8–9.

In order to process the electrical signals, the digital processing unit recognizes the various colors of the original image by analyzing the wavelengths of the light detected by the photosites 12. However, in the prior art, the green wavelengths 70 and the blue wavelengths 80 in the infrared region are processed as red wavelengths. Therefore, a digital scanning unit including a raster input scanner, for example, transmits processed signals indicating a red color, which is darker than the red color in the original image, because the photosites 12 could not differentiate between red visible light and the blue and green light in the infrared region. By applying the infrared filter layer 50 to the cover glass 40 as in the present invention, the infrared filter layer 50 filters out the light in the infrared region as shown in FIG. 7 by reference numeral 90. By applying the infrared filter layer 50 to the cover glass 40 as in the present invention, the photosites 12 will provide electrical signals to the digital processing unit, which more accurately represent the original image. Therefore, this will enhance the quality of the image output from the digital device employing the sensor cover glass 40 covering the photosensitive chips 10. Although the graph provides an example using the three primary colors, the infrared filter layer 50 also provides a similar advantage for photosites 12 covered by other selectively translucent filter materials such as cyan, magenta and yellow.

Figure 8:
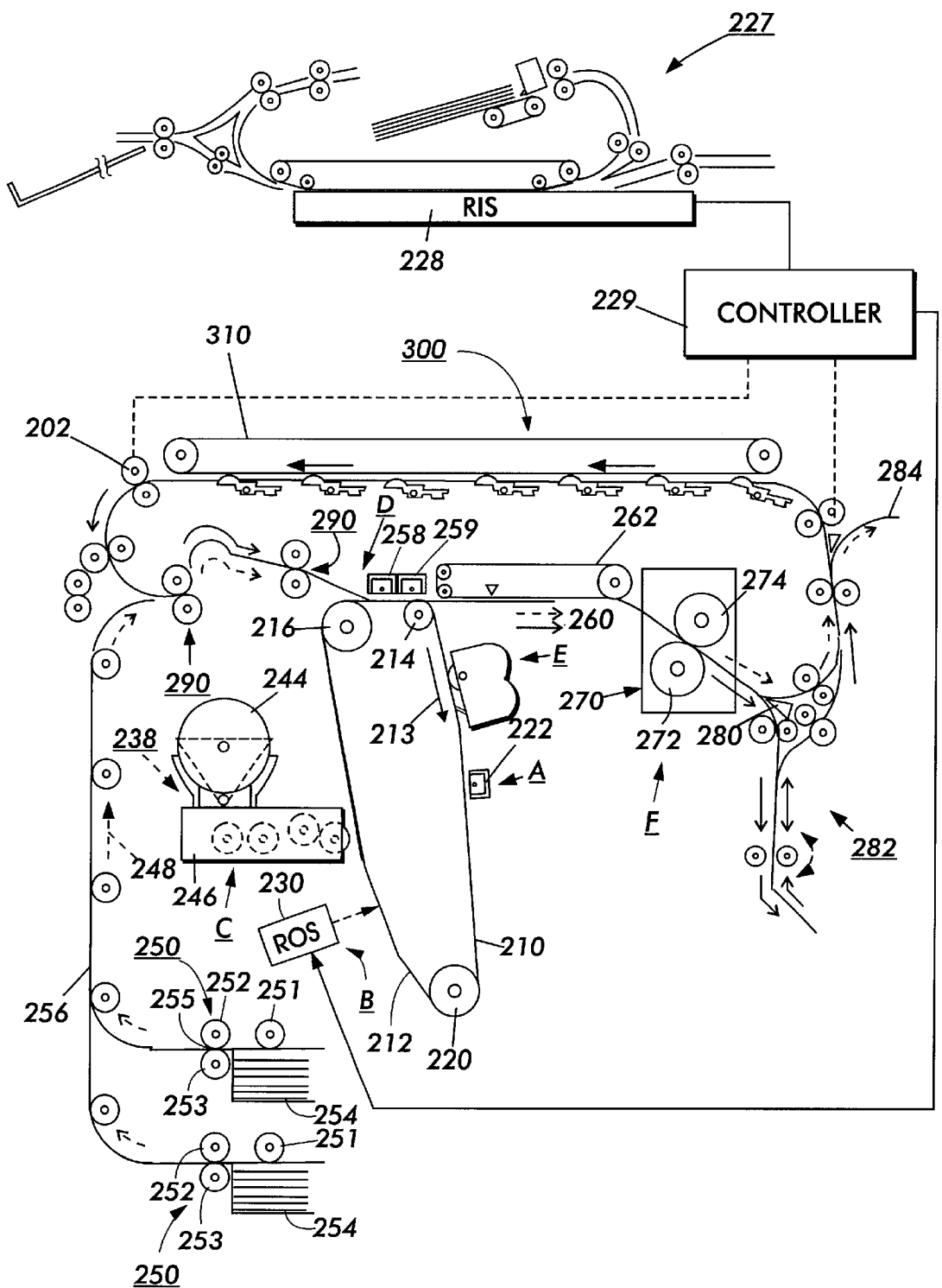
FIG. 8 is a partial schematic elevational view of an example of a digital imaging system including a scanner, which can employ the sensor cover glass of the present invention.

FIG. 8 is a partial schematic view of an example of a digital imaging system, such as the digital imaging system of U.S. Application Ser. No. 08/838,630, including a scanner, which can utilize the photosensitive chips 10 covered by the sensor cover glass 40 with infrared filter layer 50. It will be understood, however, that it is not intended to limit the invention to the embodiment disclosed. On the contrary, it is intended to cover all alternatives, modifications and equivalents as may be included within the spirit and scope of the invention as defined by the appended claims.

An original document is positioned in a document handler 227 on a raster input scanner (RIS) indicated generally by reference numeral 228. The RIS 228 contains document illumination lamps, optics, a mechanical scanning device and a plurality of photosensitive chips 10 covered by a cover glass 40 with a infrared filter layer 50 as shown in FIG. 5. The photosensitive chips 10 may include a linear array of photosites or multiple parallel linear arrays of photosites as described above. The RIS 228 captures the entire original document and converts it to a series of raster scan lines. This information is transmitted to an electronic subsystem (ESS) or controller 229 which controls a raster output scanner (ROS) 230.

The digital imaging system employs a photoconductive belt 210. Preferably, the photoconductive belt 210 is made from a photoconductive material coated on a ground layer, which, in turn, is coated on an anti-curl backing layer. Belt 210 moves in the direction of arrow 213 to advance successive portions sequentially through the various processing stations deposited about the path of movement thereof. Belt 210 is entrained about stripping roller 214, tensioning roller 220 and drive roller 216. As roller 216 rotates, it advances belt 210 in the direction of arrow 213.

Initially, a portion of the photoconductive surface passes through charging station A. At charging station A, a corona generating device indicated generally by the reference numeral 222 charges the photoconductive belt 210 to a relatively high, substantially uniform potential.

At an exposure station B, a controller or electronic subsystem (ESS) 229 receives the image signals representing the desired output image and processes these signals to convert them to a continuous tone or grayscale rendition of the image which is transmitted to a modulated output generator, for example the raster output scanner (ROS), indicated generally by reference numeral 230. Preferably, ESS 229 is a self-contained, dedicated minicomputer. The image signals transmitted to ESS 229 may originate from a RIS 228 as described above or another type of scanner utilizing the photosensitive chips 10, thereby enabling the absorption to serve as a remotely located printer for one or more scanners. Alternatively, the printer may serve as a dedicated printer for a high-speed computer or for one or more personal computers. The signals from ESS 229, corresponding to the continuous tone image desired to be reproduced by the printer, are transmitted to ROS 230. ROS 230 includes a laser with rotating polygon mirror blocks. The ROS 230 will expose the photoconductive belt 210 to record an electrostatic latent image thereon corresponding to the continuous tone image received from ESS 229. As an alternative, ROS 230 may employ a photosensitive array of light emitting diodes (LEDs) arranged to illuminate the charged portion of photoconductive belt 210 on a raster-by-raster basis.

After the electrostatic latent image has been recorded on photoconductive surface 212, belt 210 advances the latent image to a development station, C, where toner, in the form of liquid or dry particles, is electrostatically attracted to the latent image using commonly known techniques. The latent image attracts toner particles from the carrier granules forming a toner powder image thereon. As successive electrostatic latent images are developed, toner particles are depleted from the developer material. A toner particle dispenser, indicated generally by the reference numeral 244, dispenses toner particles into developer housing 246 of developer unit 238.

With continued reference to FIG. 8, after the electrostatic latent image is developed, the toner powder image present on belt 210 advances to transfer station D. A print sheet 248 is advanced to the transfer station, D, by a sheet feeding apparatus, 250. Preferably, sheet feeding apparatus 250 includes a nudger roll 251 which feeds the uppermost sheet of stack 254 to nip 255 formed by feed roll 252 and retard roll 253. Feed roll 252 rotates to advance the sheet from stack 254 into vertical transport 256. Vertical transport 256 directs the advancing sheet 248 of support material into the registration transport 290 and past image transfer station D to receive an image from photoreceptor belt 210 in a timed sequence so that the toner powder image formed thereon contacts the advancing sheet 248 at transfer station D. Transfer station D includes a corona-generating device 258, which sprays ions onto the backside of sheet 248. This attracts the toner powder image from photoconductive surface 212 to sheet 248. The sheet is then detached from the photoreceptor by corona generating device 259 which sprays oppositely charged ions onto the back side of sheet 248 to assist in removing the sheet from the photoreceptor. After transfer, sheet 248 continues to move in the direction of arrow 260 by way of belt transport 262, which advances sheet 248 to fusing station F.

Fusing station F includes a fuser assembly indicated generally by the reference numeral 270 which permanently affixes the transferred toner powder image to the copy sheet. Preferably, fuser assembly 270 includes a heated fuser roller 272 and a pressure roller 274 with the powder image on the copy sheet contacting fuser roller 272. The pressure roller 274 is loaded against the fuser roller 272 to provide the necessary pressure to fix the toner powder image to the copy sheet. The fuser roller 272 is internally heated by a quartz lamp (not shown). Release agent, stored in a reservoir (not shown), is pumped to a metering roll (not shown). A trim blade (not shown) trims off the excess release agent. The release agent transfers to a donor roll (not shown) and then to the fuser roll 272. Or alternatively, release agent is stored in a presoaked web (not shown) and applied to the fuser roll 272 by pressing the web against fuser roll 272 and advancing the web at a slow speed.

The sheet then passes through fuser 270 where the image is permanently fixed or fused to the sheet. After passing through fuser 270, a gate 280 either allows the sheet to move directly via output 284 to a finisher or stacker, or deflects the sheet into the duplex path 300, specifically, first into single sheet inverter 282 here. That is, if the sheet is either a simplex sheet, or a completed duplex sheet having both side one and side two images formed thereon, the sheet will be conveyed via gate 280 directly to output 284. However, if the sheet is being duplexed and is then only printed with a side one image, the gate 280 will be positioned to deflect that sheet into the inverter 282 and into the duplex loop path 300, where that sheet will be inverted and then fed to acceleration nip 202 and belt transports 310, for recirculation back through transfer station D and fuser 270 for receiving and permanently fixing the side two image to the backside of that duplex sheet, before it exits via exit path 284.

After the print sheet is separated from photoconductive surface 212 of belt 210, the residual toner/developer and paper fiber particles adhering to photoconductive surface 212 are removed therefrom at cleaning station E. Cleaning station E includes a rotatably mounted fibrous brush in contact with photoconductive surface 212 to disturb and remove paper fibers and a cleaning blade to remove the nontransferred toner particles. The blade may be configured in either a wiper or doctor position depending on the application. Subsequent to cleaning, a discharge lamp (not shown) floods photoconductive surface 212 with light to dissipate any residual electrostatic charge remaining thereon prior to the charging thereof for the next successive imaging cycle.

Controller or ESS 229 regulates the various printer functions. The controller or ESS 229 is preferably a programmable microprocessor, which controls all of the printer functions hereinbefore described. The controller or ESS 229 provides a comparison count of the copy sheets, the number of documents being recirculated, the number of copy sheets selected by the operator, time delays, jam corrections, etc. The control of all of the exemplary systems heretofore described may be accomplished by conventional control switch inputs from the printing machine consoles selected by the operator. Conventional sheet path sensors or switches may be utilized to keep track of the position of the document and the copy sheets.

Figure 9:
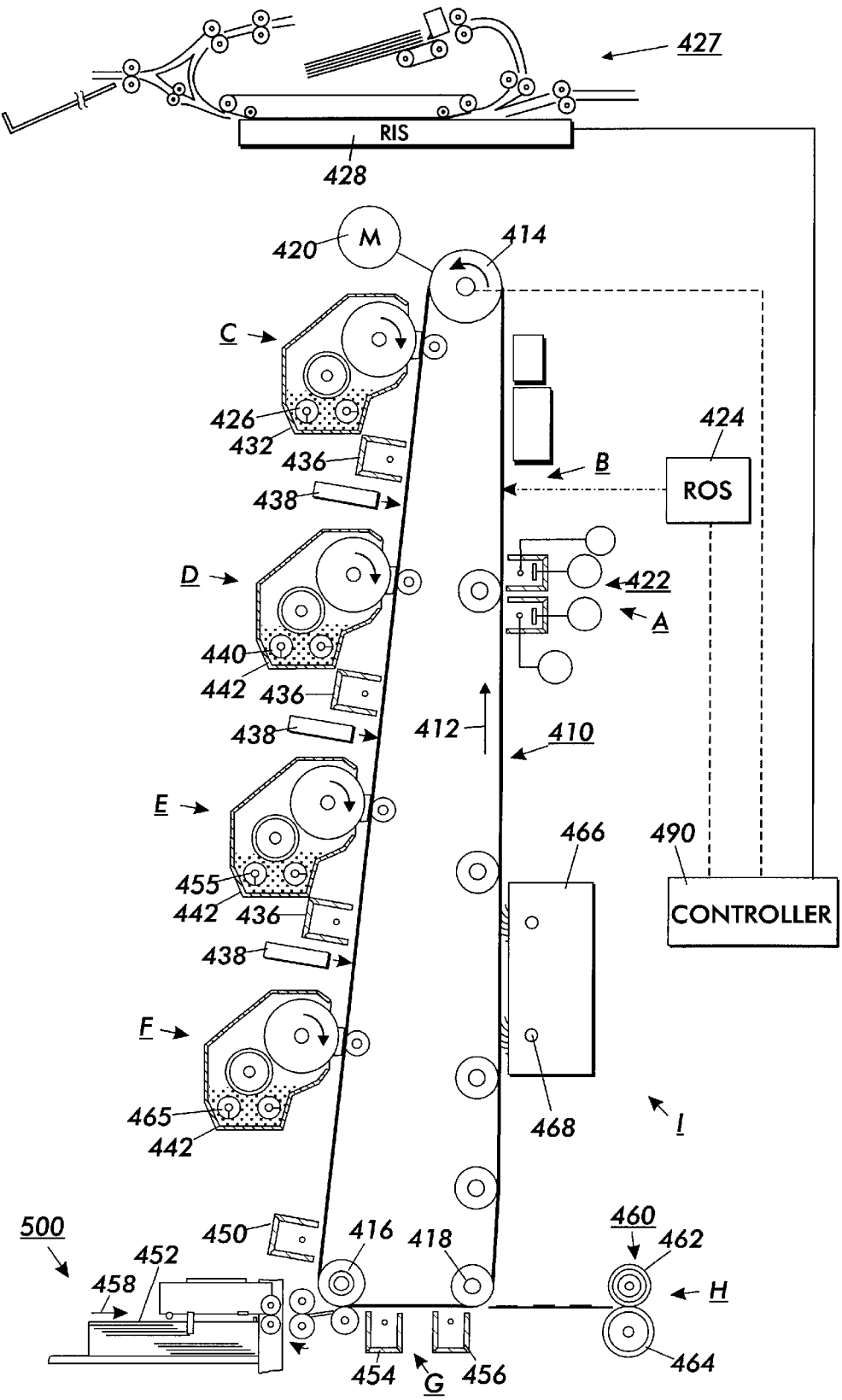
FIG. 9 is a partial schematic elevational view of another example of a digital imaging system including a scanner, which can employ the sensor cover glass of the present invention.

FIG. 9 is a partial schematic view of another example of a digital imaging system, such as the digital imaging system of U.S. Application Ser. No. 09/220,972, including a scanner, which can utilize the photosensitive chips 10 covered by the sensor cover glass 40 with infrared filter layer 50. The imaging system is used to produce color output in a single pass of a photoreceptor belt. It will be understood, however, that it is not intended to limit the invention to the embodiment disclosed. On the contrary, it is intended to cover all alternatives, modifications and equivalents as may be included within the spirit and scope of the invention as defined by the appended claims, including a multiple pass color process system, a single or multiple pass highlight color system and a black and white printing system.

In this embodiment, an original document can be positioned in a document handler 427 on a raster-input scanner (RIS) indicated generally by reference numeral 428. The RIS 428 contains document illumination lamps, optics, a mechanical scanning device and a plurality of photosensitive chips 10 covered by a cover glass 40 with an infrared filter layer 50 as shown in FIG. 5. The photosensitive chips 10 may include a linear array of photosites or multiple parallel linear arrays of photosites as described above. The RIS 428 captures the entire original document and converts it to a series of raster scan lines. This information is transmitted to an electronic subsystem (ESS) or controller 490 which controls a raster output scanner (ROS) 424.

The printing machine uses a charge retentive surface in the form of an Active Matrix (AMAT) photoreceptor belt 410 supported for movement in the direction indicated by arrow 412, for advancing sequentially through the various xerographic process stations. The belt is entrained about a drive roller 414, tension rollers 416 and fixed roller 418 and the drive roller 414 is operatively connected to a drive motor 420 for effecting movement of the belt through the xerographic stations. A portion of belt 410 passes through charging station A where a corona generating device, indicated generally by the reference numeral 422, charges the photoconductive surface of photoreceptor belt 410 to a relatively high, substantially uniform, preferably negative potential.

Next, the charged portion of photoconductive surface is advanced through an imaging/exposure station B. At imaging/exposure station B, a controller, indicated generally by reference numeral 490, receives the image signals from raster input scanner 428 representing the desired output image and processes these signals to convert them to the various color separations of the image which is transmitted to a laser based output scanning device, which causes the charge retentive surface to be discharged in accordance with the output from the scanning device. Preferably the scanning device is a laser Raster Output Scanner (ROS) 424. Alternatively, the ROS 424 could be replaced by other xerographic exposure devices such as LED arrays.

The photoreceptor belt 410, which is initially charged to a voltage $V_0$, undergoes dark decay to a level equal to about −500 volts. When exposed at the exposure station B, it is discharged to a level equal to about −50 volts. Thus after exposure, the photoreceptor belt 410 contains a monopolar voltage profile of high and low voltages, the former corresponding to charged areas and the latter corresponding to discharged or background areas.

At a first development station C, developer structure, indicated generally by the reference numeral 432 utilizing a hybrid jumping development (HJD) system, the development roll, better known as the donor roll, is powered by two development fields (potentials across an air gap). The first field is the ac jumping field which is used for toner cloud generation. The second field is the dc development field which is used to control the amount of developed toner mass on the photoreceptor belt 410. The toner cloud causes charged toner particles 426 to be attracted to the electrostatic latent image. Appropriate developer biasing is accomplished via a power supply. This type of system is a noncontact type in which only toner particles (black, for example) are attracted to the latent image and there is no mechanical contact between the photoreceptor belt 410 and a toner delivery device to disturb a previously developed, but unfixed, image.

The developed but unfixed image is then transported past a second charging device 436 where the photoreceptor belt and previously developed toner image areas are recharged to a predetermined level.

A second exposure/imaging is performed by device 438 which comprises a laser based output structure is utilized for selectively discharging the photoreceptor belt 410 on toned areas and/or bare areas, pursuant to the image to be developed with the second color toner. At this point, the photoreceptor belt 410 contains toned and untoned areas at relatively high voltage levels and toned and untoned areas at relatively low voltage levels. These low voltage areas represent image areas which are developed using discharged area development (DAD). To this end, a negatively charged, developer material 440 comprising color toner is employed. The toner, which by way of example may be yellow, is contained in a developer housing structure 442 disposed at a second developer station D and is presented to the latent images on the photoreceptor belt 410 by way of a second HSD developer system. A power supply (not shown) serves to electrically bias the developer structure to a level effective to develop the discharged image areas with negatively charged yellow toner particles 440.

The above procedure is repeated for a third image for a third suitable color toner such as magenta (station E) and for a fourth image and suitable color toner such as cyan (station F). The exposure control scheme described below may be utilized for these subsequent imaging steps. In this manner a full color composite toner image is developed on the photoreceptor belt 410.

To the extent to which some toner charge is totally neutralized, or the polarity reversed, thereby causing the composite image developed on the photoreceptor belt 410 to consist of both positive and negative toner, a negative pre-transfer dicorotron member 450 is provided to condition the toner for effective transfer to a substrate using positive corona discharge.

Subsequent to image development a sheet of support material 452 is moved into contact with the toner images at transfer station G. The sheet of support material 452 is advanced to transfer station G by a sheet feeding apparatus 500. The sheet of support material 452 is then brought into contact with photoconductive surface of photoreceptor belt 410 in a timed sequence so that the toner powder image developed thereon contacts the advancing sheet of support material 452 at transfer station G.

Transfer station G includes a transfer dicorotron 454 which sprays positive ions onto the backside of sheet 452. This attracts the negatively charged toner powder images from the photoreceptor belt 410 to sheet 452. A detack dicorotron 456 is provided for facilitating stripping of the sheets from the photoreceptor belt 410.

After transfer, the sheet of support material 452 continues to move, in the direction of arrow 458, onto a conveyor (not shown) which advances the sheet to fusing station H. Fusing station H includes a fuser assembly, indicated generally by the reference numeral 460, which permanently affixes the transferred powder image to sheet 452. Preferably, fuser assembly 460 comprises a heated fuser roller 462 and a backup or pressure roller 464. Sheet 452 passes between fuser roller 462 and backup roller 464 with the toner powder image contacting fuser roller 462. In this manner, the toner powder images are permanently affixed to sheet 452. After fusing, a chute, not shown, guides the advancing sheets 452 to a catch tray, stacker, finisher or other output device (not shown), for subsequent removal from the printing machine by the operator.

After the sheet of support material 452 is separated from photoconductive surface of photoreceptor belt 410, the residual toner particles carried by the non-image areas on the photoconductive surface are removed therefrom. These particles are removed at cleaning station I using a cleaning brush or plural brush structure contained in a housing 466. The cleaning brush 468 or brushes 468 are engaged after the composite toner image is transferred to a sheet. Once the photoreceptor belt 410 is cleaned the brushes 468 are retracted utilizing a device incorporating a clutch (not shown) so that the next imaging and development cycle can begin.

Controller 490 regulates the various printer functions. The controller 490 is preferably a programmable controller, which controls printer functions hereinbefore described. The controller 490 may provide a comparison count of the copy sheets, the number of documents being recirculated, the number of copy sheets selected by the operator, time delays, jam corrections, etc. The control of all of the exemplary systems heretofore described may be accomplished by conventional control switch inputs from the printing machine consoles selected by an operator. Conventional sheet path sensors or switches may be utilized to keep track of the position of the document and the copy sheets.

While FIGS. 8–9 show examples of a digital imaging system incorporating the sensor cover glass of the present invention, it is understood that the sensor cover glass of the present invention could be used in any digital document reading, generating or reproducing device.

While the invention has been described in detail with reference to specific and preferred embodiments, it will be appreciated that various modifications and variations will be apparent to the artisan. All such modifications and embodiments as may occur to one skilled in the art are intended to be within the scope of the appended claims

What is claimed is:

1. An assembly comprising:
    a substrate;
    a plurality of photosensitive chips mounted to the substrate and arranged to provide at least one linear array of photosites on the substrate, each of the photosensitive chips being in contact with a neighboring photosensitive chip;

a sensor cover glass covering the photosensitive chips and mounted to the substrate; and an infrared filter layer deposited on the sensor cover glass to prevent infrared light from reaching the photosensitive chips.

2. The assembly as in claim 1 wherein the infrared filter layer covers only the top surface of the sensor cover glass from one end of the cover glass to the other end of the cover glass.

3. The assembly as in claim 1 wherein the photosensitive chips provide multiple parallel linear arrays of photosites.

4. The assembly as in claim 3, wherein each multiple parallel linear array has a selectively translucent filter layer.

5. A digital device comprising:

a raster input scanner scanning documents to generate digital image signals, the raster input scanner including an assembly comprising:

a substrate;

a plurality of photosensitive chips mounted to the substrate and arranged to provide at least one linear array of photosites on the substrate, each of the photosensitive chips being in contact with a neighboring photosensitive chip;

a sensor cover glass covering the photosensitive chips and mounted to the substrate; and an infrared filter layer deposited on the sensor cover glass to prevent infrared light from reaching the photosensitive chips.

6. The digital device as in claim 5, wherein the infrared filter layer covers only the top surface of the sensor cover glass from one end of the cover glass to the other end of the cover glass.

7. The digital device as in claim 5, wherein the photosensitive chips provide multiple parallel linear arrays of photosites.

8. The digital device as in claim 7, wherein each multiple parallel linear array has a selectively translucent filter layer.

9. A digital imaging system comprising:

a raster input scanner scanning documents to generate digital image signals, the raster input scanner including an assembly comprising:

a substrate, a plurality of photosensitive chips mounted to the substrate and arranged to provide at least one linear array of photosites on the substrate, each of the photosensitive chips being in contact with a neighboring photosensitive chip, a sensor cover glass covering the photosensitive chips and mounted to the substrate, and an infrared filter layer deposited on the sensor cover glass to prevent infrared light from reaching the photosensitive chips;

a raster output scanner; and a controller directing the raster output scanner to expose a photoconductive belt to create an electrostatic latent image based on the image signals received from the raster input scanner.

10. The digital imaging system as in claim 9, wherein the infrared filter layer covers only the top surface of the sensor cover glass from one end of the cover glass to the other end of the cover glass.

11. The digital imaging system as in claim 9, wherein the photosensitive chips provide multiple parallel linear arrays of photosites.

12. The digital imaging system as in claim 11, wherein each multiple parallel linear array has a selectively translucent filter layer.

13. A digital device comprising:

a raster input scanner scanning documents to generate digital image signals, the raster input scanner including an assembly comprising:

a substrate;

a plurality of photosensitive chips mounted to the substrate and arranged to provide at least one linear array of photosites on the substrate, each of the photosensitive chips being in contact with a neighboring photosensitive chip;

a sensor cover glass covering the photosensitive chips, the sensor cover glass having bonding flanges by which the sensor cover glass is mounted to the substrate; and an infrared filter layer deposited on the sensor cover glass to prevent infrared light from reaching the photosensitive chips.

14. The digital device as in claim 13, wherein the infrared filter layer covers only the top surface of the sensor cover glass from one end of the cover glass to the other end of the cover glass.

15. The digital device as in claim 13, wherein the photosensitive chips provide multiple parallel linear arrays of photosites.

16. The digital device as in claim 15, wherein each multiple parallel linear array has a selectively translucent filter layer.

17. The digital device as in claim 14, wherein the infrared filter layer does not cover over the top of the sensor cover glass in the bonding flange area of the sensor cover glass.

* * * * *